Figure 1:
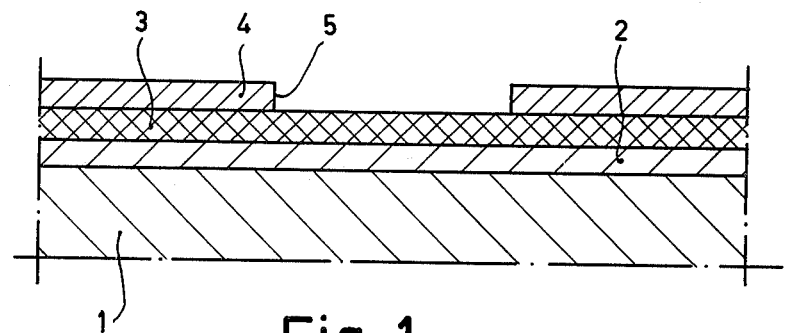

United States Patent [19]

Rioult et al.

[11] 4,322,264

[45] Mar. 30, 1982

[54] METHOD FOR SELECTIVE ETCHING OF TITANIUMDIOXIDE RELATIVE TO ALUMINUM

[75] Inventors: Jean-Pierre Rioult, Epron; Raymond Fabien, Douvres la Delivrande, both of France

[73] Assignee: U.S. Philips Corporation, New York, N.Y.

[21] Appl. No.: 241,178

[22] Filed: Mar. 6, 1981

Related U.S. Application Data

[63] Continuation of Ser. No. 152,972, May 23, 1980, abandoned, which is a continuation of Ser. No. 746,877, Dec. 2, 1976, abandoned.

[30] Foreign Application Priority Data

Dec. 9, 1975 [FR] France .............................. 75 37638

[51] Int. Cl.$^3$ ................... H01L 21/283; H01L 21/308
[52] U.S. Cl. .................................. 156/655; 156/665; 156/667; 204/29; 204/38 A; 252/79.5
[58] Field of Search ...................... 156/665, 667, 655; 252/79.5, 79.2; 204/29, 33, 38 A

[56] References Cited

U.S. PATENT DOCUMENTS

| | | | |
|---|---|---|---|
| 3,562,013 | 2/1971 | Mickelson et al. | 252/79.3 |
| 3,630,796 | 12/1971 | Yokozawa et al. | 156/667 |
| 3,761,313 | 9/1973 | Entwisle et al. | 134/2 |
| 3,841,905 | 10/1974 | Dixon | 252/79.2 |

OTHER PUBLICATIONS

Hackh's Chemical Dictionary, 4th Ed. McGraw-Hill Book Co., New York, N.Y. p. 26.
Weast, Ed. Handbook of Chemistry and Physics, The Cleveland Rubber Co., Cleveland, Ohio 1967 pp. B149.

*Primary Examiner*—Jerome W. Massie
*Attorney, Agent, or Firm*—Norman N. Spain

[57] ABSTRACT

A method of selectively etching a titanium oxide layer with a view to the formation of a mask for the localization of the anodic oxidation of an underlying metallic layer.

The method is characterized in that the material comprising the said titanium oxide layer is dipped in a solution of hydrogen peroxide and ammonia.

Application to the formation of contacts on semiconductor devices.

2 Claims, 3 Drawing Figures

METHOD FOR SELECTIVE ETCHING OF TITANIUMDIOXIDE RELATIVE TO ALUMINUM

This is a continuation of application Ser. No. 152,972, filed May 23, 1980, now abandoned, which is a continuation of Ser. No. 746,877, filed Dec. 2, 1976, now abandoned.

The present invention relates to a method of selectively etching a layer of titanium oxide used as a mask for the localization of the anodic oxidation of an oxidizable metal layer. It is already known to use the anodic oxidation of a metal layer, in particular aluminium, to effect the passivation of a semiconductor surface or the realization of localized contacts on said surface.

In order to obtain said anodic oxidation which thus is generally localized, a screen or mask is used which, for example, does not cover the parts to be oxidized and which protects the parts which must not be treated.

As a screen or mask is usually used an insulating material, either a layer of impervious alumina, or a photo-sensitive lacquer or even a layer of silicon oxide. All the various methods using said solutions present drawbacks: in fact, either defects in the localization are found in the case of alumina, or the presence of bubbles or the absence of adherence in the case of the use of photosensitive lacquer, or finally the presence of protruberances in the case of silicon oxide, the deposit of the latter necessitating in addition too high temperatures.

Taking into account these numerous difficulties, it becomes more current to form the localization mask starting from a layer of titanium oxide. Actually, titanium oxide $TiO_2$ presents the particularity of being capable of being deposited at low temperature and in a thin layer, so without bubbles. Moreover, titanium oxide has the property of resisting the corrosion and avoiding the formation of bubbles in the underlying layers.

Furthermore it is for this latter reason that the etching and/or the elimination of the $TiO_2$ layer are very difficult. Actually, experience has proved that titanium oxide can withstand a great number of diluted and cold acid solutions currently used in photoetching. It has meanwhile been found that titanium oxide is sensitive to a hydrofluoric acid and ammonium fluoride solution (FH + FN H4) but this solution also etches the metals generally deposited below the titanium oxide layer and in particular aluminium, such that it becomes useless in these conditions for the photoetching or anodic oxidation treatments. In order to mitigate this drawback it has been suggested to interpose an alumina layer between the titanium oxide layer and the underlying metal layer, the alumina presenting the property of better resisting the above etching solution than aluminium.

In these conditions, however, said alumina layer must then be removed by means of an etching solution comprising usually acetic acid and ammonium fluoride. Consequently, by this supplementary operation, the risks of deterioration of the adjacent active elements of the said aluminium layer are increased either as a result of the actual chemical treatment, or due to the manipulations necessitated by said treatment, and the costs of the resulting device are also augmented. Moreover, it may be found that the result obtained is not always that which was anticipated.

It is the object of the present invention to mitigate said drawbacks and to provide a chemical composition permitting of etching or eliminating a titanium oxide layer without damage for the adjacent regions and to simplify the etching method or anodic oxidation method.

Actually, the present invention relates to a method of selectively etching a titanium oxide layer used as a mask for the localization of the anodic oxidation of an oxidizable metal layer, characterized in that, the material supporting the said titanium oxide layer is dipped in a solution containing at least hydrogen peroxide and ammonia.

This solution presents numerous advantages. Actually, it may be used for etching the titanium oxide layer so as to give it the configuration of a mask, as well as for the elimination of the remainder of the said layer after it has been used as a mask, and it uses only current products, notably 30 weight % of $H_2O_2$ in water and a solution of $NH_3$ in water with a specific weight 0.90.

Moreover, this solution also presents the advantage of not attacking the materials generally used to form the layer below the titanium oxide layer and in particular the said solution attacks neither aluminium nor alumina.

Advantageously, the ratio of the volume of ammonia with respect to the volume of hydrogen peroxide to form the solution according to the invention is equivalent to that obtained by adding to one unit volume of 30 weight % hydrogen peroxide in water a quantity of a solution of ammonia in water of specific weight 0.90 of which the volume is between 10 and 50% of the said unit volume.

In this range of proportions, the etching rate of the titanium oxide by the solution is practically constant and it is rapid. On the contrary it has been found that for a volume of $NH_4OH$ above 50% of the volume of 30 weight % hydrogen peroxide, the etching duration is longer and longer.

The present invention also relates to the bath which is necessary for carrying out the etching method according to the invention, which bath is characterized in that it contains hydrogen peroxide and ammonia in the above-indicated ratios.

It also relates to the manufacture of a semiconductor device of which the apertures which are necessary for making contacts have been provided by the method according to the invention, which manufacture is characterized in that a titanium oxide film is deposited on a metallic layer (notably of aluminium), deposited on the surface of the semiconductor crystal, and in that a portion of the said layer is eliminated by the above-described method.

The invention will be described in greater detail, by way of example, with reference to the accompanying drawing.

This description relates to an example of the application of the method according to the invention to the manufacture of a mask for the localization of the oxidation of a metallic layer, notably for the localization of a porous alumina layer at the surface of a semiconductor device.

Figure 2:
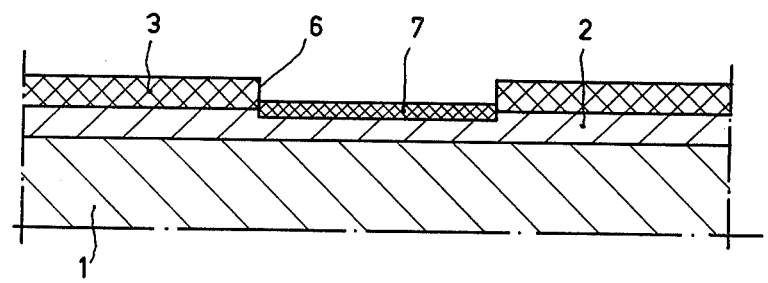
Figure 3:
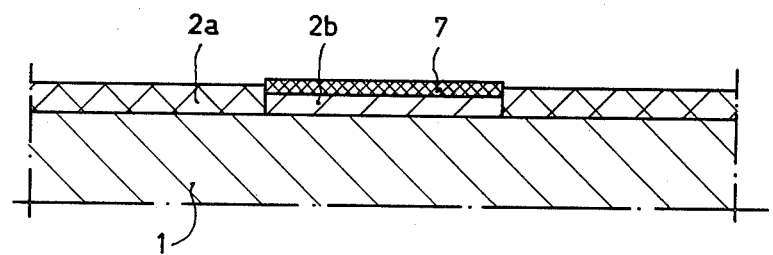

FIGS. 1 to 3 show various stages of the manufacture of a semiconductor device using the method according to the invention.

It is to be noted that in the Figures the dimensions are considerably exaggerated and not drawn to scale so as to render the drawings clearer.

Referring now to FIGS. 1 to 3, on the surface of a semiconductor material 1 in which previously active and/or passive islands have been formed, a metallic layer 2 is deposited which can be oxidized anodically and in which it is desired, for example, to form porous oxide islands: in most of the cases said layer is of aluminium or of an alloy on the basis of aluminium (Al—Si, Al—Cu, or Al—Si—Cu) and the masking is destined for the localization of islands generally consisting of porous alumina.

A layer 3 of titanium oxide $TiO_2$ is deposited on said layer 2 by known means, said deposit having the advantageous particularity that it can be effected at low temperature (150° C.).

The next operation consists of photoetching said layer 3 of titanium oxide: in order to do this the known method is used starting from localized inaviation and polimerization of a lacquer layer 4 which permits, for example, of forming the cavity 5 opposite to the zone of the layer 2 which must be maintained conductive (FIG. 1).

With the aid of the mask formed by the lacquer 4, a cavity 6 (FIG. 2) is then formed in the titanium oxide layer 3, said cavity being necessarily opposite to the aperture 5 provided in the lacquer 4. In order to obtain said cavity 6, the solution of hydrogen peroxide and ammonia is used according to the method of the invention, that is, for example, 50 cm³ of a solution of 30 weight % of $H_2O_2$ in water and 10 cm³ of a solution of $NH_3$ in water with a density=0.9.

Said cavity 6 exposes a part of the surface of the underlying aluminium layer 2.

Said surface 7 is then transformed into an impervious aluminium film, for example by the anodic oxidation method known to those skilled in the art. The structure shown in FIG. 2 is then obtained.

By means of the same solution of hydrogen peroxide and ammonia according to the invention, the remainder of the titanium oxide layer 3 is eliminated and the portion 2a of the metallic layer 2 which is not protected by the screen 7 can then easily be transformed into oxide which is generally porous. The portion 2b protected by the screen preserves its original nature and consequently remains conductive (FIG. 3) and may be used for various applications, notably as a contact.

What is claimed is:

1. A method of selectively etching a titanium oxide film covering an aluminum or an aluminum alloy substrate, relative to said substrate, comprising applying to selected portions of the exposed surface of said titanium oxide film an aqueous solution consisting essentially of an aqueous mixture of a 30% aqueous solution by weight of hydrogen peroxide and from 10 to 50% by volume of a unit of volume of said hydrogen peroxide solution of an aqueous solution of ammonia of a specific weight of 0.90 for a time sufficient for said solution to dissolve said selected portions of said titanium dioxide film while having a substantial little effect on said substrate.

2. In the method of formation of aluminum contacts in a semiconductive device wherein an aluminum film protected by titanium dioxide mask is selectively anodized, the improvement wherein the titanium dioxide mask is formed from a titanium dioxide film by selective etching in accordance with the method of claim 1.

* * * * *

UNITED STATES PATENT AND TRADEMARK OFFICE
CERTIFICATE OF CORRECTION

PATENT NO. : 4,322,264
DATED : March 30, 1982
INVENTOR(S) : JEAN-PIERRE RIOULT ET AL It is certified that error appears in the above—identified patent and that said Letters Patent is hereby corrected as shown below:

Col. 1, Line 13, Line 49, Line 55, Line 61, Col. 2, Line 22, Col. 3, Line 4, Line 30, Change "aluminium" to --aluminum--.

Col. 1, Line 36, Change "so" to --all--.

Col. 1, Line 37, cancel the "after resisting".

Col. 2, Line 47, Change "(notably of aluminium)", to --(notably of aluminum)--.

Col. 3, Line 4, Change "ium" to --um--.

Signed and Sealed this

First Day of June 1982

[SEAL]

Attest:

Attesting Officer

GERALD J. MOSSINGHOFF

Commissioner of Patents and Trademarks